United States Patent
Tsuchikawa et al.

(10) Patent No.: US 10,604,641 B2
(45) Date of Patent: *Mar. 31, 2020

(54) THERMOSETTING RESIN COMPOSITION AND PREPREG AND LAMINATE BOTH MADE WITH THE SAME

(71) Applicant: HITACHI CHEMICAL COMPANY, LTD., Tokyo (JP)

(72) Inventors: Shinji Tsuchikawa, Ibaraki (JP); Masanori Akiyama, Ibaraki (JP); Tomohiko Kotake, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/284,022

(22) Filed: Oct. 3, 2016

(65) Prior Publication Data

US 2017/0022353 A1  Jan. 26, 2017

Related U.S. Application Data

(63) Continuation of application No. 12/810,387, filed as application No. PCT/JP2008/061256 on Jun. 19, 2008, now abandoned.

(30) Foreign Application Priority Data

Dec. 25, 2007  (JP) .................................. 2007-332857

(51) Int. Cl.
| | | |
|---|---|---|
| *C08K 5/5333* | (2006.01) | |
| *C08L 63/00* | (2006.01) | |
| *B32B 15/092* | (2006.01) | |
| *C08K 3/36* | (2006.01) | |
| *B32B 15/20* | (2006.01) | |
| *C08J 5/24* | (2006.01) | |
| *C08K 3/32* | (2006.01) | |
| *C08G 59/56* | (2006.01) | |
| *B32B 5/02* | (2006.01) | |
| *C08K 3/22* | (2006.01) | |
| *C08L 63/04* | (2006.01) | |
| *C09J 163/00* | (2006.01) | |
| *C09J 163/04* | (2006.01) | |
| *H05K 1/03* | (2006.01) | |

(52) U.S. Cl.
CPC .............. *C08K 5/5333* (2013.01); *B32B 5/02* (2013.01); *B32B 15/092* (2013.01); *B32B 15/20* (2013.01); *C08G 59/56* (2013.01); *C08J 5/24* (2013.01); *C08K 3/22* (2013.01); *C08K 3/32* (2013.01); *C08K 3/36* (2013.01); *C08L 63/00* (2013.01); *C08L 63/04* (2013.01); *C09J 163/00* (2013.01); *C09J 163/04* (2013.01); *B32B 2457/08* (2013.01); *C08J 2363/00* (2013.01); *C08J 2363/04* (2013.01); *C08K 2003/2227* (2013.01); *C08L 2201/02* (2013.01); *C09J 2205/102* (2013.01); *H05K 1/0353* (2013.01); *Y10T 428/31678* (2015.04)

(58) Field of Classification Search
None
See application file for complete search history.

(56) References Cited

U.S. PATENT DOCUMENTS

| | | |
|---|---|---|
| 4,196,109 A | 4/1980 | Laganis et al. |
| 4,262,033 A | 4/1981 | Massy et al. |
| 4,400,438 A | 8/1983 | Takahashi et al. |
| 7,208,539 B2 | 4/2007 | Tsuchikawa et al. |
| 7,273,901 B2 | 9/2007 | Sicken et al. |
| 7,420,007 B2 | 9/2008 | Bauer et al. |
| 7,446,140 B2 | 11/2008 | Bauer et al. |
| 2005/0004278 A1 | 1/2005 | Knop et al. |
| 2005/0159516 A1 | 7/2005 | Kwon et al. |
| 2005/0234173 A1 | 10/2005 | Tsuchikawa et al. |

(Continued)

FOREIGN PATENT DOCUMENTS

| | | |
|---|---|---|
| JP | 57-038851 | 3/1982 |
| JP | 62-046584 | 2/1987 |

(Continued)

OTHER PUBLICATIONS

CIBA ARALDITE® ECN Product Data printed Oct. 15, 1999. (Year: 1999).*
Japanese Official Action dated Sep. 30, 2014, for JP Application No. 2007-332857.
Japanese Official Action dated Sep. 30, 2014, for JP Application No. 2013-138025.
Chinese Official Action dated Dec. 24, 2013, for CN Application No. 201210111455.1.

(Continued)

*Primary Examiner* — Monique R Jackson
(74) *Attorney, Agent, or Firm* — Fitch, Even, Tabin & Flannery, L.L.P.

(57) ABSTRACT

The present invention provides a thermosetting resin composition comprising (A) a metal salt of disubstituted phosphinic acid, (B) a maleimide compound having a N-substituted maleimide group in a molecule, (C) a 6-substituted guanamine compound or dicyandiamide and (D) an epoxy resin having at least two epoxy groups in a molecule and a prepreg and a laminated plate which are prepared by using the same. The prepregs obtained by impregnating or coating a base material with the thermosetting resin compositions of the present invention and the laminated plates produced by laminating and molding the above prepregs are balanced in all of a copper foil adhesive property, a glass transition temperature, a solder heat resistance, a moisture absorption, a flame resistance, a relative dielectric constant and a dielectric loss tangent, and they are useful as a printed wiring board for electronic instruments.

15 Claims, 1 Drawing Sheet

(56) References Cited

U.S. PATENT DOCUMENTS

| | | | |
|---|---|---|---|
| 2006/0054870 A1* | 3/2006 | Japp | H05K 1/0373 252/570 |
| 2006/0099391 A1 | 5/2006 | Tomioka et al. | |
| 2007/0082986 A1 | 4/2007 | Peters et al. | |
| 2007/0088136 A1 | 4/2007 | Hwang et al. | |
| 2010/0173163 A1 | 7/2010 | Tsuchikawa et al. | |
| 2010/0279129 A1 | 11/2010 | Tsuchikawa et al. | |
| 2012/0316263 A1 | 12/2012 | Tsuchikawa et al. | |

FOREIGN PATENT DOCUMENTS

| | | |
|---|---|---|
| JP | 62-61051 | 3/1987 |
| JP | 62109817 A | 5/1987 |
| JP | 62-132915 | 6/1987 |
| JP | 63-034899 | 2/1988 |
| JP | H01-287111 A | 11/1989 |
| JP | 2-24324 | 1/1990 |
| JP | 02-258820 | 10/1990 |
| JP | 03-145476 | 6/1991 |
| JP | 06-008342 | 1/1994 |
| JP | 06-032969 | 2/1994 |
| JP | 10-067942 | 3/1998 |
| JP | 2001-011672 | 1/2001 |
| JP | 2001-261939 A | 9/2001 |
| JP | 2002-284963 A | 10/2002 |
| JP | 2004-339509 | 2/2004 |
| JP | 2005-248147 | 9/2005 |
| JP | 2006-143850 | 6/2006 |
| JP | 2007-186675 | 7/2007 |
| JP | 2007-231246 | 9/2007 |
| JP | 2008-110959 A | 5/2008 |
| JP | 2008-133353 | 6/2008 |
| JP | 2009-105283 | 5/2009 |
| JP | 2009-155399 A | 7/2009 |
| JP | 2013-209671 A | 10/2013 |
| WO | 2003/087230 A1 | 10/2003 |
| WO | 2007/142140 | 12/2007 |
| WO | 2007/142140 A1 | 12/2007 |

OTHER PUBLICATIONS

Extended European Search Report dated Oct. 22, 2012, including Supplemental European Search Report and European Search Opinion, for EP Application No. 08777412.1-210/2226349 (PCT/JP2008/061256).

Singapore Official Action dated Sep. 27, 2010, for Singapore Application No. 201004210-9.

Notification of Reasons for Refusal dated Sep. 26, 2014, for Japanese Application No. 2007-332857, together with English language translation thereof.

Written Argument dated Jul. 1, 2013, for Japanese Application No. 2007-332857, together with English language translation thereof.

Decision of Refusal dated Mar. 11, 2014, for Japanese Application No. 2007-332857, together with English language translation thereof.

Written Amendment dated Jun. 18, 2014, for Japanese Application No. 2007-332857, together with English language translation thereof.

Written Amendment dated Jul. 23, 2014, for Japanese Application No. 2007-332857, together with English language translation thereof.

Notification of Reasons for Refusal dated Apr. 22, 2013, for Japanese Application No. 2007-332857, together with English language translation thereof.

Search Report dated Feb. 26, 2014, for Japanese Application No. 2013-138025, together with English language translation thereof.

Written Amendment dated Jun. 18, 2014, for Japanese Application No. 2013-138025, together with English language translation thereof.

Notification of Reasons for Refusal dated Jun. 23, 2014, for Japanese Application No. 2013-138025, together with English language translation thereof.

Written Argument dated Dec. 1, 2014, for Japanese Application No. 2013-138025, together with English language translation thereof.

Decision to Grant a Patent dated Dec. 12, 2014, for Japanese Appl. No. 2013-138025, together with English language translation thereof.

English language machine translation of JP 62-109817, published May 21, 1987.

English language machine translation of JP 57-038851, published Mar. 3, 1982.

* cited by examiner

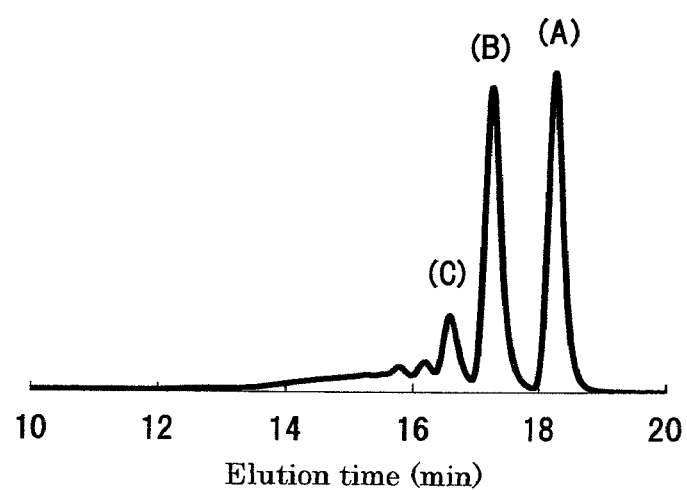

THERMOSETTING RESIN COMPOSITION AND PREPREG AND LAMINATE BOTH MADE WITH THE SAME

CROSS-REFERENCE TO RELATED APPLICATIONS

This application is a continuation of U.S. application Ser. No. 12/810,387, filed Jun. 24, 2010, which U.S. national phase application filed under 35 U.S.C. § 371 of International Application No. PCT/JP2008/061256, filed Jun. 19, 2008, designating the United States, which claims priority from Japanese Patent Application No. 2007-332857, filed Dec. 25, 2007, the complete disclosures of which are hereby incorporated herein by reference in their entirety for all purposes.

BACKGROUND OF THE INVENTION

The present invention relates to a thermosetting resin composition which is balanced in all of a metal foil adhesive property, a heat resistance, a moisture resistance, a flame resistance, a metal-stuck heat resistance and dielectric characteristics (a relative dielectric constant and a dielectric loss tangent), low in a toxicity and excellent in a safety and a working environment and which is suitably used for electronic parts and the like and a prepreg and a laminated plate which are prepared by using the same.

RELATED ART

Thermosetting resins are widely used in the fields of electronic parts and the like to which a high reliability is required since a specific cross-linking structure thereof displays a high heat resistance and a high dimensional stability. Particularly in copper clad laminated plates and interlayer insulating materials, a high copper foil adhesive property for forming fine wirings and a workability in carrying out works such as boring and the like by drilling and punching are required as well in order to meet requirements for density growth in recent years.

Mounting of electronic parts produced by using lead-free solders and flame retardation free of halogens are required due to environmental problems in recent years, and this requires the higher heat resistance and the higher flame resistance than those of conventional ones. Further, in order to enhance a safety of the products and the working environment, desired is a thermosetting resin composition which is constituted only from components having a low toxicity and which does not generate toxic gases and the like.

A bismaleimide compound is a curing agent for thermosetting resins which are excellent in dielectric characteristics, a flame resistance and a heat resistance. Publicly known bismaleimide compounds do not have a curing reactivity with epoxy resins, and therefore when they are used as they are for thermosetting resins of an epoxy curing base, the problem that the heat resistance is short has been involved therein. That is, disclosed are cases (refer to, for example, a patent document 1 and a patent document 2) regarding thermosetting resins in which adducts of bismaleimide compounds and aminophenol are produced by heating and kneading without using solvents and used. However, a yield of the adducts of the bismaleimide compounds and aminophenol is low, and when they are used for copper clad laminated plates and interlayer insulating materials, the heat resistance, the workability and the like are short.

Melamine resins which are thermosetting resins and guanamine compounds are excellent in an adhesive property, a flame resistance and a heat resistance, but they are short of a solubility in organic solvents, and there have been involved therein the problems that it is difficult to produce thermosetting resin compositions without using a large amount of nitrogen atom-containing organic solvents such as N,N-dimethylformamide and the like which are highly toxic and that the storage stability is short. Further, copper clad laminated plates and interlayer insulating materials which are prepared by using the above thermosetting resins have involved the problem that they contaminate various chemical liquids such as a plating liquid and the like when producing electronic parts and the like.

A lot of cases regarding thermosetting resins prepared by using melamine resins and guanamine compounds are known as resins for solving the above problems (refer to, for example, patent documents 3 to 7).

They are thermosetting resins prepared by condensing melamine resins and guanamine compounds using aldehydes such as formaldehyde and the like and improved in a solubility in organic solvents, but they have a low thermal decomposition temperature and generate toxic cracked gases, so that they deteriorate the working environment and are short of a heat resistance against lead-free solders and a copper-stuck heat resistance which are required in recent years. Further, in fine working treatment and formation of wirings, they are short of a copper foil adhesive property, a flexibility and a toughness, and brought about are the failures that the circuit patterns are broken or peeled and that cracks are produced in carrying out works such as boring and the like by drilling and punching.

Also, a case (refer to, for example, a patent document 8) regarding methyloled guanamine resins is disclosed, but problems on the heat resistance, the adhesive property, the workability and the like are involved therein as is the case with those described above.

Further, disclosed is a case (refer to, for example, a patent document 9) regarding thermosetting resins prepared by using adducts of bismaleimide compounds and aminobenzoic acid which are produced without using an organic solvent, benzoguanamine formaldehyde condensation products and the like, but they have a low thermal decomposition temperature and are short of a heat resistance against lead-free solders and a copper-stuck heat resistance which are required in recent years.

Also, phosphorus-containing compounds used as publicly known non-halogen base flame retardants include red phosphorus, soluble phosphoric ester compounds such as triphenyl phosphate and the like, reactive phosphorus-containing compounds such as phosphorus-containing epoxy resins and the like and ammonium polyphosphate and the like. It has been found that thermosetting resins prepared by using the above compounds are notably reduced in dielectric characteristics (a relative dielectric constant and a dielectric loss tangent), a heat resistance, a moisture resistance, an electric corrosion resistance and the like.

Patent document 1: Japanese Patent Publication No. 34899/1988
Patent document 2: Japanese Patent Application Laid-Open No. 32969/1994
Patent document 3: Japanese Patent Publication No. 46584/1987
Patent document 4: Japanese Patent Application Laid-Open No. 67942/1998
Patent document 5: Japanese Patent Application Laid-Open No. 11672/2001

Patent document 6: Japanese Patent Application Laid-Open No. 258820/1990
Patent document 7: Japanese Patent Application Laid-Open No. 145476/1991
Patent document 8: Japanese Patent Publication No. 61051/1987
Patent document 9: Japanese Patent Publication 8342/1994

DISCLOSURE OF THE INVENTION

In light of the above existing situations, an object of the present invention is to provide a thermosetting resin composition which is balanced in all of a metal foil adhesive property, a heat resistance, a moisture resistance, a flame resistance, a metal-stuck heat resistance, a relative dielectric constant and a dielectric loss tangent and a prepreg and a laminated plate which are prepared by using the same.

Intensive researches repeated by the present inventors in order to achieve the object described above have resulted in finding that a thermosetting resin composition comprising a metal salt of disubstituted phosphinic acid, a maleimide compound, a 6-substituted guanamine compound or dicyandiamide and an epoxy resin meets the object described above and that it is advantageously used as a thermosetting resin composition for a laminated plate. The present invention has been completed based on the above knowledge.

That is, the present invention provides a thermosetting resin composition, a prepreg and a laminated plate each shown below.

1. A thermosetting resin composition comprising:
(A) a metal salt of disubstituted phosphinic acid,
(B) a maleimide compound having a N-substituted maleimide group in a molecule,
(C) a 6-substituted guanamine compound represented by the following Formula (1) or dicyandiamide and
(D) an epoxy resin having at least two epoxy groups in a molecule:

[Ka 1]

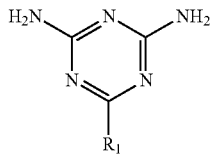
(1)

(wherein $R_1$ represents phenyl, methyl, allyl, vinyl, butyl, methoxy or benzyloxy).

2. The thermosetting resin composition according to the above item 1, wherein the maleimide compound (B) having a N-substituted maleimide group in a molecule contains a compound having an acidic substituent and an unsaturated maleimide group represented by the following Formula (3) or Formula (4), which is a product produced by reacting (b-1) a maleimide compound having at least two N-substituted maleimide groups in a molecule with (b-2) an amine compound having an acidic substituent represented by the following Formula (2) in an organic solvent:

[Ka 2]

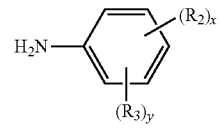
(2)

(wherein $R_2$ each represents independently an acidic substituent selected from a hydroxyl group, a carboxy group and a sulfonic acid group; $R_3$ each represents independently a hydrogen atom, an aliphatic hydrocarbon group having 1 to 5 carbon atoms or a halogen atom; x is an integer of 1 to 5, and y is an integer of 0 to 4; and a sum of x and y is 5):

[Ka 3]

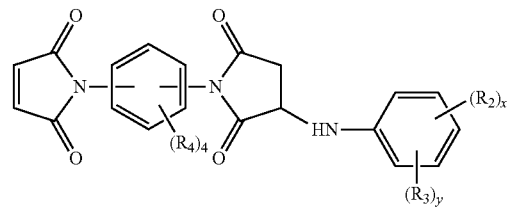
(3)

(wherein $R_2$, $R_3$, x and y represent the same ones as in Formula (2); $R_4$ each represents independently a hydrogen atom, an aliphatic hydrocarbon group having 1 to 5 carbon atoms or a halogen atom);

[Ka 4]

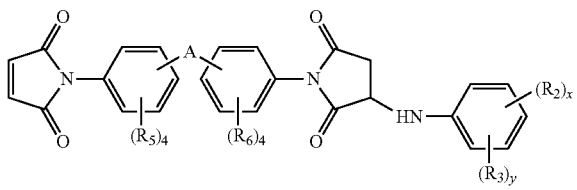
(4)

(wherein $R_2$, $R_3$, x and y represent the same ones as in Formula (2); $R_5$ and $R_6$ each represent independently a hydrogen atom, an aliphatic hydrocarbon group having 1 to 5 carbon atoms or a halogen atom; and A is an alkylene group, an alkylidene group, an ether group, a sulfonyl group or a group represented by the following Formula (5):

[Ka 5]

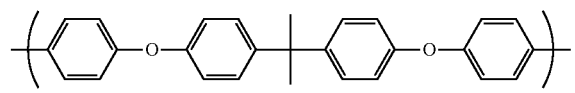
(5)

3. A prepreg obtained by impregnating or coating a base material with the thermosetting resin composition according to the above item 1 or 2 and then subjecting it to a B stage.

4. A laminated plate obtained by laminating and molding the prepreg according to the above item 3.
5. The laminated plate according to the above item 4, wherein it is a metal clad laminated plate obtained by superposing a metal foil on at least one side of the prepreg and then heating, pressing and molding it.

The thermosetting resin composition of the present invention is balanced in all of a metal foil adhesive property, a heat resistance, a moisture resistance, a flame resistance, a metal-stuck heat resistance, a relative dielectric constant and a dielectric loss tangent, and it has a low toxicity and is excellent as well in a safety and a working environment.

Accordingly, a prepreg and a laminated plate which have excellent performances can be provided by the present invention using the above thermosetting resin composition.

BRIEF EXPLANATION OF THE DRAWING

FIG. 1 is a gas chromatographic chart drawing showing a result obtained by analyzing a solution of the maleimide compound (B-2) obtained in Production Example 2 by GPC.

BEST MODE FOR CARRYING OUT THE INVENTION

The present invention shall be explained below in details.
The thermosetting resin composition of the present invention is characterized by comprising (A) a metal salt of disubstituted phosphinic acid, (B) a maleimide compound having a N-substituted maleimide group in a molecule, (C) a 6-substituted guanamine compound represented by the following Formula (1) or dicyandiamide and (D) an epoxy resin having at least two epoxy groups in a molecule.

First, the metal salt of disubstituted phosphinic acid which is the component (A) can be represented by the following Formula (6):

[Ka 6]

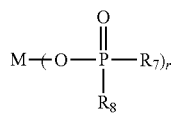

(6)

(wherein $R_7$ and $R_8$ each represent independently an aliphatic hydrocarbon group having 1 to 5 carbon atoms or an aromatic hydrocarbon group; M represents metal selected from Li, Na, K, Mg, Ca, Sr, Ba, Al, Ge, Sn, Sb, Bi, Zn, Ti, Zr, Mn, Fe and Ce; and r is an integer of 1 to 9).

The above metal salt of disubstituted phosphinic acid can be produced by a method described in Japanese Patent Application Laid-Open No. 2686/2001. Also, it can be obtained commercially from Clariant AG. Addition of the above metal salt of disubstituted phosphinic acid as an essential component makes it possible to provide the excellent flame resistance, low dielectric characteristics and heat and moisture resistance.

The metal M in Formula (6) is preferably Al or Na from the viewpoints of making it possible to increase a content of phosphorus in the compound and the moisture resistance, and it is particularly preferably Al from the viewpoint of the dielectric characteristics.

Further, $R_9$ and $R_{10}$ in Formula (6) are preferably an aliphatic hydrocarbon group having 1 to 5 carbon atoms from the viewpoint of making it possible to increase a content of phosphorus in the compound, and they are particularly preferably methyl, ethyl or propyl.

The maleimide compound having a N-substituted maleimide group in a molecule which is the component (B) includes N-phenylmaleimide and N-hydroxyphenylmaleimide as the maleimide compound having one N-substituted maleimide group in a molecule, and the maleimide compound having two N-substituted maleimide groups in a molecule is preferred.

The maleimide compound having at least two N-substituted maleimide groups in a molecule which is the component (B) includes, for example, bis(4-maleimidephenyl)methane, poly(maleimidephenyl)methane, bis(4-maleimidephenyl) ether, bis(4-maleimidephenyl)sulfone, 3,3-dimethyl-5,5-ethyl-4,4-diphenylmethanebismaleimide, 4-methyl-1,3-phenylnebismaleimide, m-phenylenebismaleimide, 2,2-bis[4-(4-maleimidephenoxy)phenyl]propane and the like. Among them, bis(4-maleimidephenyl)methane, m-phenylenebismaleimide and bis(4-maleimidephenyl)sulfone which have a high reactivity and can provide the thermosetting resin composition with a higher heat resistance are preferred, and m-phenylenebismaleimide and bis(4-maleimidephenyl)methane are more preferred from the viewpoint that they are inexpensive. Bis(4-maleimidephenyl)methane is particularly preferred in terms of a solubility in solvents.

Further, the compound having an acidic substituent and an unsaturated maleimide group which is produced by reacting (b-1) the maleimide compound having at least two N-substituted maleimide groups in a molecule as described above with (b-2) the amine compound having an acidic substituent represented by the following Formula (2) in an organic solvent is suitably used as the component (B):

[Ka 7]

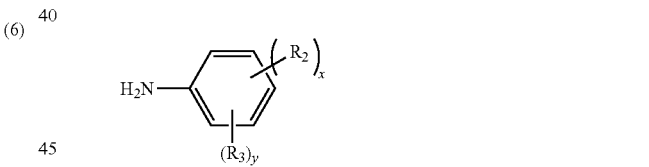

(2)

(wherein $R_2$ each represents independently an acidic substituent selected from a hydroxyl group, a carboxy group and a sulfonic acid group; $R_3$ each represents independently a hydrogen atom, an aliphatic hydrocarbon group having 1 to 5 carbon atoms or a halogen atom; x is an integer of 1 to 5, and y is an integer of 0 to 4; and a sum of x and y is 5).

The amine compound (b-2) represented by Formula (2) includes, for example, m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, 3,5-dicarboxyaniline and the like, and among them, m-aminophenol, p-aminophenol, p-aminobenzoic acid, m-aminobenzoic acid and 3,5-dihydroxyaniline are preferred from the viewpoints of a solubility and a yield in the synthesis. o-Aminophenol, m-aminophenol and p-aminophenol are more preferred from the viewpoint of a heat resistance, and p-aminophenol is particularly preferred from the viewpoint of dielectric characteristics.

In respect to a use ratio of the maleimide compound (b-1) to the amine compound (b-2), an equivalent ratio of an equivalent of a maleimide group in the maleimide compound (b-1) to an equivalent of the amine compound (b-2) in terms of a —$NH_2$ group falls preferably in a range represented by the following equation:

1.0≤(equivalent of maleimide group)/(equivalent in terms of a —$NH_2$ group)≤10.0 and the above equivalent ratio falls more preferably in a range of 2.0 to 10.0. The above equivalent ratio falling in the range described above prevents the thermosetting resin from being short of a solubility in a solvent and the gelation from being brought about and prevents the thermosetting resin from being reduced in a heat resistance.

The organic solvent used in the above reaction shall not specifically be restricted and includes, for example, alcohol base solvents such as ethanol, propanol, butanol, methyl cellosolve, butyl cellosolve, propylene glycol monomethyl ether and the like, ketone base solvents such as acetone, methyl ethyl ketone, methyl isobutyl ketone, cyclohexanone and the like, ether base solvents such as tetrahydrofuran and the like, aromatic solvents such as toluene, xylene, mesitylene and the like, nitrogen-containing solvents such as dimethylformamide, dimethylacetamide, N-methylpyrrolidone and the like, sulfur-containing solvents such as dimethyl sulfoxide and the like. They can be used alone or in a mixture of two or more kinds thereof.

Among the above organic solvents, cyclohexanone, propylene glycol monomethyl ether and methyl cellosolve are preferred in terms of a solubility, and cyclohexanone and propylene glycol monomethyl ether are more preferred in terms of a low toxicity. Propylene glycol monomethyl ether which has a high volatility and is less liable to remain as a residual solvent in producing the prepreg is particularly preferred.

A use amount of the organic solvent is preferably 10 to 1000 parts by mass, more preferably 100 to 500 parts by mass and particularly preferably 200 to 500 parts by mass per 100 parts by mass of the sum of the maleimide compound (b-1) and the amine compound (b-2).

Controlling a use amount of the organic solvent to 10 parts by mass or more makes the solubility sufficiently high, and controlling it to 1000 parts by mass or less prevents the reaction time from being extended too much.

The reaction temperature is preferably 50 to 200° C., more preferably 100 to 160° C. The reaction time is preferably 0.1 to 10 hours, more preferably 1 to 8 hours.

A reaction catalyst can optionally be used, if necessary, in the above reaction. The reaction catalyst shall not specifically be restricted and includes, for example, amines such as triethylamine, pyridine, tributylamine and the like, imidazoles such as methylimidazole, phenylimidazole and the like and phosphorus base catalysts such as triphenylphosphine and the like. They can be used alone or in a mixture of two or more kinds thereof.

The compound having an acidic substituent and an unsaturated maleimide group represented by the following Formula (3) or Formula (4) is synthesized by reacting a bis(4-maleimidephenyl) compound used as the maleimide compound (b-1) with the amine compound (b-2) according to the above reaction:

[Ka 8]

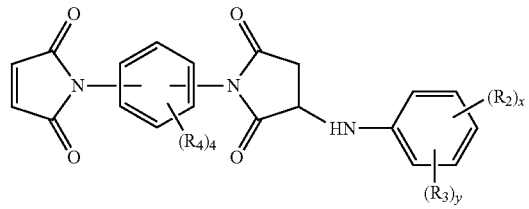

(3)

(wherein $R_2$, $R_3$, x and y represent the same ones as in Formula (2); $R_4$ each represents independently a hydrogen atom, an aliphatic hydrocarbon group having 1 to 5 carbon atoms or a halogen atom);

[Ka 9]

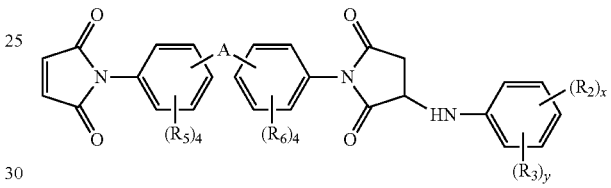

(4)

(wherein $R_2$, $R_3$, x and y represent the same ones as in Formula (2); $R_5$ and $R_6$ each represent independently a hydrogen atom, an aliphatic hydrocarbon group having 1 to 5 carbon atoms or a halogen atom; and A is an alkylene group, an alkylidene group, an ether group, a sulfonyl group or a group represented by the following Formula (5):

[Ka 10]

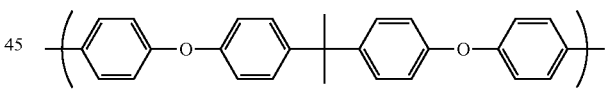

(5)

The component (C) is a 6-substituted guanamine compound represented by the following Formula (1) or dicyandiamide. The 6-substituted guanamine compound represented by Formula (1) includes, for example, 2,4-diamino-6-phenyl-s-triazine called benzoguanamine, 2,4-diamino-6-methyl-s-triazine called acetoguanamine, 2,4-diamino-6-vinyl-s-triazine and the like. Among them, benzoguanamine and 2,4-diamino-6-vinyl-s-triazine which have a high reactivity and which can provide the higher heat resistance and the lower dielectric constant are more preferred, and benzoguanamine is particularly preferred from the viewpoint of a low cost and a solubility in a solvent. Dicyandiamide is particularly preferred as well from the viewpoints that it is excellent in a storage stability in the vanish and can provide the higher heat resistance and the lower dielectric constant and that it is inexpensive. The 6-substituted guanamine compound represented by Formula (1) and dicyandiamide may be used in combination.

[Ka 11]

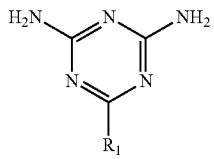

(1)

(wherein $R_1$ represents phenyl, methyl, allyl, vinyl, butyl, methoxy or benzyloxy).

The component (D) shall not specifically be restricted as long as it is an epoxy resin having two or more epoxy groups in a molecule, and it includes, for example, glycidyl ethers of a bisphenol A base, a bisphenol F base, a biphenyl base, a novolac base, a multifunctional phenol base, a naphthalene base, an alicyclic base and an alcohol base, glycidyl amines, glycidyl esters and the like. They can be used alone or in a mixture of two or more kinds thereof.

Among them, bisphenol F type epoxy resins, dicyclopentadiene type epoxy resins, naphthalene ring-containing epoxy resins, biphenyl type epoxy resins, biphenyl aralkyl type epoxy resins, phenol novolac type epoxy resins and cresol novolac type epoxy resins are preferred from the viewpoints of dielectric characteristics, a heat resistance, a moisture resistance and a metal foil adhesive property, and the dicyclopentadiene type epoxy resins, the biphenyl aralkyl type epoxy resins, the biphenyl type epoxy resins and the phenol novolac type epoxy resins are more preferred from the viewpoints of dielectric characteristics and a high glass transition temperature. The phenol novolac type epoxy resins and the dicyclopentadiene type epoxy resins are particularly preferred from the viewpoint of a moisture and heat resistance.

A content of the component (A) contained in the thermosetting resin composition of the present invention is set to preferably 1 to 99 parts by mass, more preferably 5 to 70 parts by mass and particularly preferably 5 to 50 parts by mass based on 100 parts by mass of a sum of the masses of the components (B) to (D) in terms of a solid matter. Setting a content of the component (A) to 1 part by mass or more enhances the flame resistance, and setting it to 98 parts by mass or less prevents the heat resistance and the adhesive property from being reduced.

The contents of the components (B) to (D) contained in the thermosetting resin composition of the present invention are set preferably as follows in terms of a mass based on 100 parts by mass of a sum of the masses of the components (B) to (D) in terms of a solid matter.

A content of the component (B) is set to preferably 1 to 98.9 parts by mass, more preferably 20 to 98.9 parts by mass and particularly preferably 20 to 90 parts by mass. Setting a content of the component (B) to 1 part by mass or more enhances the flame resistance, the adhesive property and the dielectric characteristics, and setting it to 98.9 parts by mass or less prevents the heat resistance from being reduced.

A content of the component (C) is set to preferably 0.1 to 50 parts by mass, more preferably 0.5 to 50 parts by mass and particularly preferably 0.5 to 30 parts by mass. Setting a content of the component (C) to 0.1 part by mass or more enhances the solubility and the dielectric characteristics, and setting it to 50 parts by mass or less prevents the flame resistance from being reduced.

A content of the component (D) is set to preferably 1 to 80 parts by mass, more preferably 10 to 70 parts by mass and particularly preferably 20 to 60 parts by mass. Setting a content of the component (D) to 1 part by mass or more enhances the heat resistance, the flame resistance and the moldability in using the thermosetting resin composition for a prepreg, and setting it to 80 parts by mass or less prevents the dielectric characteristics from being reduced.

A curing agent and a curing accelerating agent for an epoxy resin may be used as a component (E) in combination for the thermosetting resin composition of the present invention. The examples of the curing agent for an epoxy resin include acid anhydrides such as maleic anhydride, maleic anhydride copolymers and the like, amine compounds such as diaminodiphenylmethane and the like and phenol compounds such as phenol novolac, cresol novolac and the like. Also, the examples of the curing accelerating agent for an epoxy resin include imidazoles and derivatives thereof, tertiary amines, quaternary ammonium salts and the like. Among them, the maleic anhydride copolymers which improve the heat resistance are preferred, and copolymer resins of polymerizable monomers constituted from carbon atoms and hydrogen atoms such as styrene, ethylene, propylene, isobutylene and the like with maleic anhydride are more preferred since the dielectric constant can be reduced. Copolymer resins of styrene with maleic anhydride or copolymer resins of isobutylene with maleic anhydride are particularly preferred in terms of a solubility in a solvent and a compatibility with resins blended.

A content of the component (E) is set to preferably 0 to 50 parts by mass, more preferably 5 to 40 parts by mass and particularly preferably 5 to 30 parts by mass based on 100 parts by mass of a sum of the masses of the components (B) to (D) in terms of a solid matter. Setting a content of the component (E) to 50 parts by mass or less prevents the moldability, the adhesive property and the flame resistance from being reduced.

An inorganic filler can optionally be added as a component (F) to the thermosetting resin of the present invention. The examples of the inorganic filler include silica, mica, talc, short fibers or fine powders of glass and hollow glass, antimony trioxide, calcium carbonate, quartz powder, aluminum hydroxide, magnesium hydroxide and the like. Among them, silica, aluminum hydroxide and magnesium hydroxide are preferred from the viewpoints of the dielectric characteristics, the heat resistance and the flame resistance, and silica and aluminum hydroxide are more preferred since they are inexpensive.

A content of the component (F) is preferably 0 to 300 parts by mass, more preferably 20 to 200 parts by mass and particularly preferably 20 to 150 parts by mass based on 100 parts by mass of a sum of the masses of the components (B) to (D) in terms of a solid matter. Setting a content of the component (F) to 300 parts by mass or less prevents the moldability and the adhesive property from being reduced.

Publicly known thermoplastic resins, elastomers, flame retardants, organic fillers and the like can optionally be added as resin compositions to the thermosetting resin composition of the present invention to such an extent that the properties of the thermosetting resin are not damaged.

The examples of the thermoplastic resin include polytetrafluoroethylene, polyethylene, polypropylene, polystyrene, polyphenylene ether resins, phenoxy resins, polycarbonate resins, polyester resins, polyamide resins, polyimide resins, xylene resins, petroleum resins, silicone resins and the like.

The examples of the elastomer include polybutadiene, polyacrylonitrile, epoxy-modified polybutadiene, maleic anhydride-modified polybutadiene, phenol-modified polybutadiene, carboxy-modified polyacrylonitrile and the like.

The examples of the flame retardant include halogen base flame retardants containing bromine and chlorine, phosphorus base flame retardants such as triphenyl phosphate, tricresyl phosphate, trisdichloropropyl phosphate, phosphazene, red phosphorus and the like and flame retardants of inorganic matters such as antimony trioxide, aluminum hydroxide, magnesium hydroxide and the like. Among the above flame retardants, the phosphorus base flame retardants and the flame retardants of inorganic matters are preferred in terms of the environment. Also, the phosphorus base flame retardants used in combination with the flame retardants of inorganic matters such as aluminum hydroxide and the like are particularly preferred from the viewpoints that they are inexpensive and that the flame resistance and the heat resistance are consistent with other characteristics.

The examples of the organic filler include silicone powders and organic powders of polytetrafluoroethylene, polyethylene, polypropylene, polystyrene, polyphenylene ether and the like.

In the thermosetting resin composition of the present invention, an organic solvent can optionally be used as a diluent solvent. The above organic solvent shall not specifically be restricted and includes, for example, ketone base solvents such as acetone, methyl ethyl ketone, methyl isobutyl ketone, cyclohexanone and the like, alcohol base solvents such as methyl cellosolve and the like, ether base solvents such as tetrahydrofuran and the like and aromatic solvents such as toluene, xylene, mesitylene and the like. They can be used alone or in a mixture of two or more kinds thereof.

Further, a UV absorber, an antioxidant, a photopolymerization initiator, a fluorescent whitening agent, an adhesion improving agent and the like can optionally be added as well to the above thermosetting resin composition. They shall not specifically be restricted and include, for example, a UV absorber such as benzotriazoles and the like, an antioxidant such as hindered phenols, styrenated phenols and the like, a photopolymerization initiator such as benzophenones, benzyl ketals, thioxanthones and the like, a fluorescent whitening agent such as stilbene derivatives and the like, a urea compound such as urea silane and the like and an adhesion improving agent such as silane coupling agents and the like.

The prepreg of the present invention is obtained by impregnating or coating a base material with the thermosetting resin composition of the present invention and then subjecting it to a B stage. That is, the base material is impregnated or coated with the thermosetting resin composition of the present invention and then semi-cured (subjected to a B stage) by heating or the like to produce the prepreg of the present invention. The prepreg of the present invention shall be explained below in details.

Known base materials used for laminated plates for various electric insulating materials can be used for the base material used for the prepreg of the present invention. The examples of the material thereof include fibers of inorganic matters such as E glass, D glass, S glass, Q glass and the like, fibers of organic matters such as polyimides, polyesters, polytetrafluoroethylene and the like and mixtures thereof. The above base materials have shapes such as a woven fabric, an unwoven fabric, a roving, a chopped strand mat, a surfacing mat and the like. The material and the shape are selected according to the uses and the performances of the targeted molding, and the materials and the shapes can be used, if necessary, alone or in combination of two more kinds thereof.

A thickness of the base material shall not specifically be restricted, and the base material having a thickness of, for example, about 0.03 to 0.5 mm can be used. The base materials subjected to surface treatment with a silane coupling agent and the like or mechanically subjected to fiber opening treatment are suited from the viewpoints of a heat resistance, a moisture resistance and a workability. The base material is impregnated or coated with the resin composition so that an amount of the resin composition adhered on the base material is 20 to 90% by mass in terms of a resin content in the prepreg after dried, and then it is semi-cured (subjected to a B stage) by heating and drying usually at a temperature of 100 to 200° C. for 1 to 30 minutes, whereby the prepreg of the present invention can be obtained.

The laminated plate of the present invention can be obtained by laminating and molding the prepreg of the present invention. That is, it is laminated and molded in a constitution in which, for example, 1 to 20 sheets of the prepreg of the present invention are superposed and in which a metal foil of copper, aluminum or the like is disposed on one surface or both surfaces thereof. Conditions in methods of, for example, laminated plates and multilayer plates for electric insulating materials can be applied to the molding conditions thereof, and the laminated plate can be molded in the ranges of a temperature of 100 to 250° C., a pressure of 0.2 to 10 MPa and a heating time of 0.1 to 5 hours by means of, for example, a multistage press, a multistage vacuum press, continuous molding, an autoclave molding machine and the like. Further, the prepreg of the present invention combined with a wiring board for an inner layer is laminated and molded, whereby a multilayer plate can be produced as well.

EXAMPLES

Next, the present invention shall be explained with reference to examples shown below, but the present invention shall not be restricted by these examples.

The performances of copper clad laminated plates obtained in the following examples were measured and evaluated by the following methods.

(1) Evaluation of a Copper Foil Adhesive Property (Copper Foil Peeling Strength)

A base plate for evaluation was prepared by dipping a copper clad laminated plate in a copper etching liquid to thereby remove the copper foil allowing a band part having a width of 1 cm to remain, and a peeling strength of the band part was measured by means of an autograph (AG-100C manufactured by Shimadzu Corporation).

(2) Measurement of Glass Transition Temperature (Tg)

A base plate of 5 mm square for evaluation was prepared by dipping a copper clad laminated plate in a copper etching liquid to thereby remove the copper foil, and a glass transition temperature thereof was evaluated by observing a thermal expansion characteristic of the base plate for evaluation by means of a TMA test equipment (TMA2940 manufactured by Du Pont Co., Ltd.).

(3) Evaluation of a Solder Heat Resistance

A base plate of 5 mm square for evaluation was prepared by dipping a copper clad laminated plate in a copper etching liquid to thereby remove the copper foil, and it was left standing on the conditions of 121° C. and 0.2 MPa for 4 hours by means of a pressure cooker test equipment (manufactured by Hirayama Manufacturing Corporation). Next, it was dipped in a solder bath having a temperature of 288° C. for 20 seconds, and then an appearance of the base plate for evaluation was observed to thereby evaluate a solder heat resistance.

(4) Evaluation of a Copper-Stuck Heat Resistance (T-288)

A base plate of 5 mm square for evaluation was prepared from a copper clad laminated plate, and time passing until blister was generated on the base plate for evaluation at 288° C. was measured to thereby evaluate the copper-stuck heat resistance by means of a TMA test equipment (TMA2940 manufactured by Du Pont Co., Ltd.).

(5) Evaluation of a Moisture Absorption (Water Absorption Coefficient)

A base plate for evaluation was prepared by dipping a copper clad laminated plate in a copper etching liquid to thereby remove the copper foil, and it was left standing on the conditions of 121° C. and 0.2 MPa for 4 hours by means of a pressure cooker test equipment (manufactured by Hirayama Manufacturing Corporation). Then, a water absorption coefficient of the base plate for evaluation was measured.

(6) Evaluation of a Flame Resistance

A base plate for evaluation was prepared by dipping a copper clad laminated plate in a copper etching liquid to thereby remove the copper foil, and a base plate for evaluation was prepared by cutting out from the above base plate for evaluation in a length of 127 mm and a width of 12.7 mm and evaluated according to a test method (V method) of UL94.

(7) Measurement of a Relative Dielectric Constant and a Dielectric Loss Tangent

A base plate for evaluation was prepared by dipping a copper clad laminated plate in a copper etching liquid to thereby remove the copper foil, and a relative dielectric constant and a dielectric loss tangent thereof were measured at a frequency of 1 GHz by means of a relative dielectric constant measuring device (HP4291B, manufactured by Hewlett-Packard Company).

Production Example 1

Production of a Maleimide Compound (B-1)

A reactor having a volume of 2 liter which was equipped with a thermometer, a stirring device and a moisture determining device equipped with a reflux condenser and which could be heated and cooled was charged with 358.0 g of bis(4-maleimidephenyl)methane, 54.5 g of m-aminophenol and 412.5 g of propylene glycol monomethyl ether ((maleimide group equivalent)/(equivalent in terms of a —$NH_2$ group)=4.0), and they were reacted for 5 hours while refluxing to obtain a solution of a maleimide compound (B-1).

Production Example 2

Production of a Maleimide Compound (B-2)

A reactor having a volume of 2 liter which was equipped with a thermometer, a stirring device and a moisture determining device equipped with a reflux condenser and which could be heated and cooled was charged with 358.0 g of bis(4-maleimidephenyl)methane, 54.5 g of p-aminophenol and 412.5 g of propylene glycol monomethyl ether ((maleimide group equivalent)/(equivalent in terms of a —$NH_2$ group)=4.0), and they were reacted for 5 hours while refluxing to obtain a solution of a maleimide compound (B-2).

The above solution was analyzed by GPC (gel permeation chromatography, eluent: tetrahydrofuran), and a result thereof is shown in FIG. 1.

According to FIG. 1, a peak of p-aminophenol appearing in the vicinity of an elution time of about 19 minutes was not observed, and peaks (B) and (C) originating in the addition products were confirmed. In this case, the peak (A) shows bis(4-maleimidephenyl)methane which is the synthetic raw material; the peak (B) shows a reaction product represented by the following chemical formula (7); and the peak (C) shows a side-reaction product represented by the following chemical formula (8):

[Ka 12]

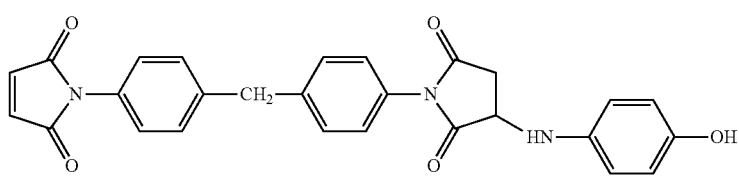

(7)

[Ka 13]

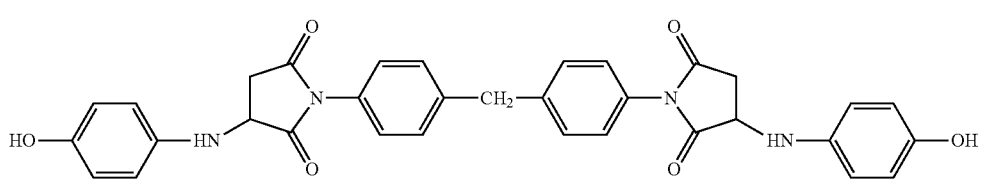

(8)

Production Example 3

Production of a Maleimide Compound (B-3)

A reactor having a volume of 2 liter which was equipped with a thermometer, a stirring device and a moisture determining device equipped with a reflux condenser and which could be heated and cooled was charged with 358.0 g of bis(4-maleimidephenyl)methane, 27.4 g of p-aminobenzoic acid and 385.4 g of N,N-dimethylacetamide ((maleimide group equivalent)/(equivalent in terms of a —$NH_2$ group)=10.0), and they were reacted at 140° C. for 5 hours to obtain a solution of a maleimide compound (B-3).

Production Example 4

Production of a Maleimide Compound (B-4)

A reactor having a volume of 1 liter which was equipped with a thermometer, a stirring device and a moisture determining device equipped with a reflux condenser and which could be heated and cooled was charged with 268.0 g of m-phenylenebismaleimide, 109.0 g of m-aminophenol and 377.0 g of N,N-dimethylacetamide ((maleimide group equivalent)/(equivalent in terms of a —$NH_2$ group)=2.0), and they were reacted at 140° C. for 5 hours to obtain a solution of a maleimide compound (B-4).

Production Example 5

Production of a Maleimide Compound (B-5)

A reactor having a volume of 2 liter which was equipped with a thermometer, a stirring device and a moisture determining device equipped with a reflux condenser and which could be heated and cooled was charged with 442.0 g of 3,3-dimethyl-5,5-diethyl-4,4-diphenylmethanebismaleimide, 54.5 g of p-aminophenol and 496.5 g of propylene glycol monomethyl ether ((maleimide group equivalent)/(equivalent in terms of a —$NH_2$ group)=4.0), and they were reacted for 5 hours while refluxing to obtain a solution of a maleimide compound (B-5).

Production Example 6

Production of a Maleimide Compound (B-6)

A reactor having a volume of 2 liter which was equipped with a thermometer, a stirring device and a moisture determining device equipped with a reflux condenser and which could be heated and cooled was charged with 442.0 g of 3,3-dimethyl-5,5-diethyl-4,4-diphenylmethanebismaleimide, 54.5 g of o-aminophenol and 496.5 g of propylene glycol monomethyl ether ((maleimide group equivalent)/(equivalent in terms of a —$NH_2$ group)=4.0), and they were reacted for 5 hours while refluxing to obtain a solution of a maleimide compound (B-6).

Production Example 7

Production of a Maleimide Compound (B-7)

A reactor having a volume of 2 liter which was equipped with a thermometer, a stirring device and a moisture determining device equipped with a reflux condenser and which could be heated and cooled was charged with 408.0 g of bis(4-maleimidephenyl)sulfone, 54.5 g of p-aminophenol and 462.5 g of N,N-dimethylacetamide ((maleimide group equivalent)/(equivalent in terms of a —$NH_2$ group)=4.0), and they were reacted at 100° C. for 2 hours to obtain a solution of a maleimide compound (B-7).

Production Example 8

Production of a Maleimide Compound (B-8)

A reactor having a volume of 2 liter which was equipped with a thermometer, a stirring device and a moisture determining device equipped with a reflux condenser and which could be heated and cooled was charged with 360.0 g of bis(4-maleimidephenyl)methane, 54.5 g of p-aminophenol and 414.5 g of N,N-dimethylacetamide ((maleimide group equivalent)/(equivalent in terms of a —$NH_2$ group)=4.0), and they were reacted at 100° C. for 2 hours to obtain a solution of a maleimide compound (B-8).

Production Example 9

Production of a Maleimide Compound (B-9)

A reactor having a volume of 2 liter which was equipped with a thermometer, a stirring device and a moisture determining device equipped with a reflux condenser and which could be heated and cooled was charged with 570.0 g of 2,2'-bis[4-(4-maleimidephenoxy)phenyl]propane, 54.5 g of p-aminophenol and 624.5 g of propylene glycol monomethyl ether ((maleimide group equivalent)/(equivalent in terms of a —$NH_2$ group)=4.0), and they were reacted at 120° C. for 2 hours to obtain a solution of a maleimide compound (B-9).

Production Example 10

Production of a Maleimide Compound (B-10)

A reactor having a volume of 2 liter which was equipped with a thermometer, a stirring device and a moisture determining device equipped with a reflux condenser and which could be heated and cooled was charged with 282.0 g of 4-methyl-1,3-phenylenebismaleimide, 54.5 g of p-aminophenol and 336.5 g of N,N-dimethylacetamide ((maleimide group equivalent)/(equivalent in terms of a —$NH_2$ group)=4.0), and they were reacted at 120° C. for 2 hours to obtain a solution of a maleimide compound (B-10).

Examples 1 to 20 and Comparative Examples 1 to 8

Used were an aluminum salt of methyl ethyl phosphinate (manufactured by Clariant AG.) or an aluminum salt of diethyl phosphinate (manufactured by Clariant AG.) as a metal salt of disubstituted phosphinic acid which was the component (A), bis(4-maleimidephenyl)methane (manufactured by Daiwakasei Industry Co, Ltd.), 2,2'-bis[4-(4-maleimidephenoxy)phenyl]propane (manufactured by Daiwakasei Industry Co, Ltd.) or the maleimide compounds (B-1 to 10) obtained in Production Examples 1 to 10 as the maleimide compound of the component (B), benzoguanamine (manufactured by Nippon Shokubai Co., Ltd.), acetoguanamine, 2,4-diamino-6-vinyl-s-triazine or dicyandiamide (manufactured by Kanto Chemical Co., Inc.) as the 6-substituted guanamine compound of the component (C), a phenol novolac type epoxy resin (D-1, trade name: Epicron N-770, manufacture by Dainippon Ink & Chemicals Inc.) or a dicyclopentadiene type epoxy resin (D-2, trade name: HP-7200H, manufacture by Dainippon Ink & Chemicals Inc.) as the epoxy resin of the component (D), a copolymer resin of styrene and maleic anhydride (E-1, trade name: SMA-EF-40, manufacture by Sartomer Co., Ltd.) or a copolymer resin of isobutylene and maleic anhydride (E-2, trade name: Isobam #600, manufacture by Kuraray Co., Ltd.) as the epoxy resin curing agent of the component (E), crushed silica (F-1, trade name: F05-30, manufacture by Fukushima Yogyo Co., Ltd., average particle diameter: 10 μm) or aluminum hydroxide (F-2, trade name: HD-360, manufacture by Showa Denko K.K., average particle diameter: 3 μm) as the inorganic filler of the component (F) and methyl ethyl ketone as the diluent solvent, and they were mixed in blend proportions (parts by mass) shown in Table 1 to Table 4 to obtain homogeneous vanishes having a resin content of 65% by mass.

In Comparative Examples 4 to 6, red phosphorus (trade name: Hishiguard TP-10F, manufacture by Nippon Chemical Industrial Co., Ltd.), triphenyl phosphate (manufacture by Kanto Chemical Co., Inc.) or phosphoric ester (trade name: PX-200, manufacture by Daihachi Chemical Industry Co., Ltd.) was used in place of a metal salt of disubstituted phosphinic acid which was the component (A).

Next, an E glass cloth having a thickness of 0.2 mm was impregnated and coated with the vanish described above and heated and dried at 160° C. for 10 minutes to obtain a prepreg having a resin content of 55% by mass.

Four sheets of the above prepregs were superposed, and electrolytic copper foils of 18 μm were disposed at the upper and lower sides and pressed at a pressure of 2.45 MPa and a temperature of 185° C. for 90 minutes to obtain a copper clad laminated plate. The copper clad laminated plate thus obtained was used to measure and evaluate a copper foil adhesive property (copper foil peeling strength), a glass transition temperature, a solder heat resistance, a moisture absorption (water absorption coefficient), a flame resistance, a relative dielectric constant (1 GHz) and a dielectric loss tangent (1 GHz) by the methods described above. The evaluation results thereof are shown in Table 1 to Table 4.

TABLE 1

| | Example | | | | | |
|---|---|---|---|---|---|---|
| | 1 | 2 | 3 | 4 | 5 | 6 |
| Thermosetting resin composition (parts by mass) | | | | | | |
| Component (A) | | | | | | |
| Aluminum salt (A-1) of methyl ethyl phosphinate | 10 | | 10 | 20 | 20 | 20 |
| Aluminum salt (A-2) of diethyl phosphinate | | 10 | | | | |
| Component (B) | | | 40 | | | |
| Bis(4-maleimidephenyl)methane | 30 | 30 | | | | |
| 2,2'-Bis[4-(4-maleimidephenoxy)phenyl]propane | | | 30 | | | |
| Maleimide compound (B-1) | | | | 40 | | |
| Maleimide compound (B-2) | | | | | 40 | |
| Maleimide compound (B-3) | | | | | | 40 |
| Component (C) | | | | | | |
| Benzoguanamine | 10 | 10 | | 10 | 10 | 10 |
| Acetoguanamine | | | 10 | | | |
| 2,4-Diamino-6-vinyl-s-triazine | | | | | | |
| Dicyandiamide | | | | | | |
| Component (D) | | | | | | |
| Phenol novolac type epoxy resin (D-1) | 60 | 60 | 60 | 50 | 50 | 50 |
| Dicyclopentadiene type epoxy resin (D-2) | | | | | | |
| Component (E): curing agent for epoxy resin | | | | | | |
| Copolymer resin (E-1) of styrene and maleic anhydride | | | | | | |
| Copolymer resin (E-2) of isobutylene and maleic anhydride | | | | | | |
| Component (F): inorganic filler | | | | | | |
| Crushed silica (F-1) | 40 | 30 | 40 | 40 | 40 | 40 |
| Aluminum hydroxide (F-2) | 10 | 20 | 10 | | | |
| Measurement and evaluation results | | | | | | |
| (1) Copper foil adhesive property (copper foil peeling strength: kN/m) | 1.60 | 1.65 | 1.69 | 1.62 | 1.61 | 1.60 |
| (2) Glass transition temperature (Tg, ° C.) | 200 | 205 | 198 | 230 | 230 | 235 |
| (3) Solder heat resistance | Good | Good | Good | Good | Good | Good |
| (4) Copper-stuck heat resistance (T-288, minute) | >60 | >60 | >60 | >60 | >60 | >60 |
| (5) Moisture absorption (water absorption coefficient: %) | 0.5 | 0.5 | 0.5 | 0.5 | 0.6 | 0.5 |
| (6) Flame resistance | V-0 | V-0 | V-0 | V-0 | V-0 | V-0 |
| (7) Relative dielectric constant (1 GHz) | 4.2 | 4.3 | 4.3 | 4.0 | 4.1 | 4.0 |
| (8) Dielectric loss tangent (1 GHz) | 0.006 | 0.006 | 0.006 | 0.005 | 0.005 | 0.005 |

TABLE 2

| | Example | | | | | |
|---|---|---|---|---|---|---|
| | 7 | 8 | 9 | 10 | 11 | 12 |
| Thermosetting resin composition (parts by mass) Component (A) | | | | | | |
| Aluminum salt (A-1) of methyl ethyl phosphinate | 20 | 20 | 20 | 20 | 20 | 20 |
| Aluminum salt (A-2) of diethyl phosphinate | | | | | | |
| Component (B) | | | | | | |
| Maleimide compound (B-1) | | | | | | |
| Maleimide compound (B-2) | | | | | | |
| Maleimide compound (B-3) | | | | | | |
| Maleimide compound (B-4) | 40 | | | | | |
| Maleimide compound (B-5) | | 40 | | | | |
| Maleimide compound (B-6) | | | 40 | | | |
| Maleimide compound (B-7) | | | | 40 | | |
| Maleimide compound (B-8) | | | | | 40 | |
| Maleimide compound (B-9) | | | | | | 40 |
| Maleimide compound (B-10) | | | | | | |
| Component (C) | | | | | | |
| Benzoguanamine | 10 | 10 | 10 | 10 | 10 | 10 |
| Acetoguanamine | | | | | | |
| 2,4-Diamino-6-vinyl-s-triazine | | | | | | |
| Dicyandiamide | | | | | | |
| Component (D) | | | | | | |
| Phenol novolac type epoxy resin (D-1) | 50 | 50 | 50 | 50 | 50 | 50 |
| Dicyclopentadiene type epoxy resin (D-2) | | | | | | |
| Component (E): curing agent for epoxy resin | | | | | | |
| Copolymer resin (E-1) of styrene and maleic anhydride | | | | | | |
| Copolymer resin (E-2) of isobutylene and maleic anhydride | | | | | | |
| Component (F): inorganic filler | | | | | | |
| Crushed silica (F-1) | 40 | 40 | 40 | 40 | 40 | 40 |
| Aluminum hydroxide (F-2) | | | | | | |
| Measurement and evaluation results | | | | | | |
| (1) Copper foil adhesive property (copper foil peeling strength: kN/m) | 1.60 | 1.65 | 1.65 | 1.65 | 1.65 | 1.65 |
| (2) Glass transition temperature (Tg, ° C.) | 240 | 235 | 225 | 245 | 245 | 245 |
| (3) Solder heat resistance | Good | Good | Good | Good | Good | Good |
| (4) Copper-stuck heat resistance (T-288, minute) | >60 | >60 | >60 | >60 | >60 | >60 |
| (5) Moisture absorption (water absorption coefficient: %) | 0.6 | 0.5 | 0.5 | 0.5 | 0.6 | 0.5 |
| (6) Flame resistance | V-0 | V-0 | V-0 | V-0 | V-0 | V-0 |
| (7) Relative dielectric constant (1 GHz) | 4.1 | 3.8 | 3.7 | 4.1 | 4.1 | 4.1 |
| (8) Dielectric loss tangent (1 GHz) | 0.004 | 0.003 | 0.002 | 0.003 | 0.003 | 0.003 |

TABLE 3

| | Example | | | | | | | |
|---|---|---|---|---|---|---|---|---|
| | 13 | 14 | 15 | 16 | 17 | 18 | 19 | 20 |
| Thermosetting resin composition (parts by mass) Component (A) | | | | | | | | |
| Aluminum salt (A-1) of methyl ethyl phosphinate | 20 | | 50 | | 10 | 10 | 10 | 10 |
| Aluminum salt (A-2) of diethyl phosphinate | | 20 | | 20 | | | | |
| Component (B) | | | | | | | | |
| Maleimide compound (B-1) | | 40 | 40 | | 30 | 40 | 40 | 60 |
| Maleimide compound (B-2) | | | | | | | | |
| Maleimide compound (B-3) | | | | | | | | |
| Maleimide compound (B-4) | | | | 40 | | | | |
| Maleimide compound (B-5) | | | | | | | | |
| Maleimide compound (B-6) | | | | | | | | |
| Maleimide compound (B-7) | | | | | | | | |

TABLE 3-continued

|  | Example | | | | | | | |
|---|---|---|---|---|---|---|---|---|
|  | 13 | 14 | 15 | 16 | 17 | 18 | 19 | 20 |
| Maleimide compound (B-8) | | | | | | | | |
| Maleimide compound (B-9) | | | | | | | | |
| Maleimide compound (B-10) | 40 | | | | | | | |
| Component (C) | | | | | | | | |
| Benzoguanamine | 10 | | 10 | | | | | |
| Acetoguanamine | | | | | | | | |
| 2,4-Diamino-6-vinyl-s-triazine | | 10 | | 10 | | | | |
| Dicyandiamide | | | | | 1 | 2 | 2 | 5 |
| Component (D) | | | | | | | | |
| Phenol novolac type epoxy resin (D-1) | 50 | 50 | 50 | | 40 | 50 | | 25 |
| Dicyclopentadiene type epoxy resin (D-2) | | | | 50 | | | 50 | |
| Component (E): curing agent for epoxy resin | | | | | | | | |
| Copolymer resin (E-1) of styrene and maleic anhydride | | | | | 29 | 8 | | 10 |
| Copolymer resin (E-2) of isobutylene and maleic anhydride | | | | | | | 8 | |
| Component (F): inorganic filler | | | | | | | | |
| Crushed silica (F-1) | 40 | 40 | | 20 | 40 | 40 | 40 | 40 |
| Aluminum hydroxide (F-2) | | | | 20 | 10 | 10 | 10 | 10 |
| Measurement and evaluation results | | | | | | | | |
| (1) Copper foil adhesive property (copper foil peeling strength: kN/m) | 1.60 | 1.65 | 1.65 | 1.65 | 1.60 | 1.60 | 1.60 | 1.60 |
| (2) Glass transition temperature (Tg, °C.) | 240 | 235 | 225 | 245 | 200 | 200 | 200 | 250 |
| (3) Solder heat resistance | Good | Good | Good | Good | Good | Good | Good | Good |
| (4) Copper-stuck heat resistance (T-288, minute) | >60 | >60 | >60 | >60 | >60 | >60 | >60 | >60 |
| (5) Moisture absorption (water absorption coefficient: %) | 0.5 | 0.5 | 0.6 | 0.5 | 0.2 | 0.5 | 0.5 | 0.3 |
| (6) Flame resistance | V-0 | V-0 | V-0 | V-0 | V-0 | V-0 | V-0 | V-0 |
| (7) Relative dielectric constant (1 GHz) | 4.1 | 3.8 | 3.7 | 4.1 | 3.9 | 4.0 | 3.9 | 3.9 |
| (8) Dielectric loss tangent (1 GHz) | 0.004 | 0.003 | 0.002 | 0.003 | 0.002 | 0.005 | 0.003 | 0.002 |

TABLE 4

|  | Comparative Example | | | | | | | |
|---|---|---|---|---|---|---|---|---|
|  | 1 | 2 | 3 | 4 | 5 | 6 | 7 | 8 |
| Thermosetting resin composition (parts by mass) | | | | | | | | |
| Component (A) | | | | | | | | |
| Aluminum salt (A-1) of methyl ethyl phosphinate | 20 | | | | | | | |
| Aluminum salt (A-2) of diethyl phosphinate | | | | | | | | |
| Component (B) | | | | | | | | |
| Bis(4-maleimidephenyl)-methane | | 30 | 40 | | 30 | | 30 | |
| 2,2'-Bis[4-(4-maleimidephenoxy)-phenyl]propane | | | | 30 | | 30 | | 30 |
| Component (C) | | | | | | | | |
| Benzoguanamine | 10 | | | 10 | | | | |
| Acetoguanamine | | 10 | | | | | | |
| 2,4-Diamino-6-vinyl-s-triazine | | | | | 10 | 10 | | |
| Dicyandiamide | | | | | | | 10 | 5 |
| Component (D) | | | | | | | | |
| Phenol novolac type epoxy resin (D-1) | 90 | 60 | 60 | | | | | 60 |
| Dicyclopentadiene type epoxy resin (D-2) | | | | 60 | 60 | 60 | 60 | |

TABLE 4-continued

|  | Comparative Example | | | | | | | |
|---|---|---|---|---|---|---|---|---|
|  | 1 | 2 | 3 | 4 | 5 | 6 | 7 | 8 |
| Component (F): inorganic filler | | | | | | | | |
| Crushed silica (F-1) | | | 20 | | | | | |
| Aluminum hydroxide (F-2) | | | 20 | | | | | |
| (Phosphorus base flame retardant) | | | | | | | | |
| Red phosphorus (F-1) | | | | 20 | | | | |
| Triphenyl phosphate (F-2) | | | | | 20 | | | |
| Phosphoric ester (F-3) | | | | | | 20 | 20 | 20 |
| Measurement and evaluation results | | | | | | | | |
| (1) Copper foil adhesive property (copper foil peeling strength: kN/m) | 0.90 | 0.90 | 0.70 | 0.45 | 0.45 | 0.45 | 0.40 | 0.45 |
| (2) Glass transition temperature (Tg, ° C.) | 140 | 150 | 130 | 120 | 120 | 120 | 120 | 120 |
| (3) Solder heat resistance | Swollen | Swollen | Swollen | Swollen | Swollen | Swollen | Swollen | Swollen |
| (4) Copper-stuck heat resistance (T-288, minute) | 1 | 1 | 1 | 0 | 0 | 0 | 0 | 0 |
| (5) Moisture absorption (water absorption coefficient: %) | 1.1 | 1.1 | 0.8 | 1.1 | 1.1 | 1.1 | 1.3 | 1.5 |
| (6) Flame resistance | V-1 | Burned | Burned | V-1 | Burned | Burned | Burned | Burned |
| (7) Relative dielectric constant (1 GHz) | 4.9 | 4.9 | 5.1 | 5.1 | 5.1 | 5.1 | 5.2 | 5.3 |
| (8) Dielectric loss tangent (1 GHz) | 0.014 | 0.014 | 0.017 | 0.023 | 0.023 | 0.023 | 0.025 | 0.026 |

As apparent from the results shown in Table 1 to Table 3, a balance is kept in all of the copper foil adhesive property (copper foil peeling strength), the glass transition temperature (Tg), the solder heat resistance (T-288), the moisture absorption (water absorption coefficient), the flame resistance, the relative dielectric constant (1 GHz) and the dielectric loss tangent (1 GHz) in the examples of the present invention.

On the other hand, as apparent from the results shown in Table 4, the laminated plates which are balanced in all of a copper foil adhesive property, a glass transition temperature, a solder heat resistance, a moisture absorption, a flame resistance, a relative dielectric constant and a dielectric loss tangent are not found in the comparative examples, and they are inferior in any of characteristics.

INDUSTRIAL APPLICABILITY

The prepregs obtained by impregnating or coating the base material with the thermosetting resin compositions of the present invention and the laminated plates produced by laminating and molding the above prepregs are balanced in all of a copper foil adhesive property, a glass transition temperature, a solder heat resistance, a moisture absorption, a flame resistance, a relative dielectric constant and a dielectric loss tangent, and they are useful as a printed wiring board for electronic instruments.

What is claimed is:
1. A thermosetting resin composition comprising;
   (A) a metal salt of disubstituted phosphinic acid,
   (B) a maleimide compound having a N-substituted maleimide group in a molecule,
   (C) dicyandiamide, and
   (D) an epoxy resin having at least two epoxy groups in a molecule; and wherein a content of the component (A) is 1 to 99 parts by mass based on 100 parts by mass of a sum of the masses of the components (B) to (D) in terms of a solid matter, and a content of the component (B) is 1 to 98.9 parts by mass, a content of the component (C) is 0.1 to 50 parts by mass, a content of the component (D) is 1 to 80 parts by mass in terms of a mass based on 100 parts by mass of a sum of the masses of the components (B) to (D) in terms of a solid matter, wherein the component (B) includes a compound represented by the following Formula (3) or Formula (4):

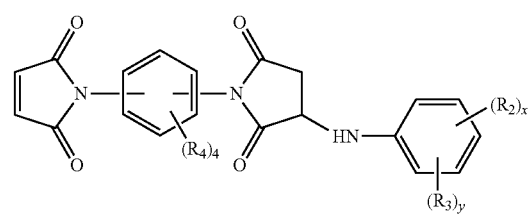

(3)

wherein $R_2$ each represents independently an acidic substituent selected from a hydroxyl group, a carboxy group and a sulfonic acid group; $R_3$ each represents independently a hydrogen atom, an aliphatic hydrocarbon group having 1 to 5 carbon atoms or a halogen atom; x is an integer of 1 to 5; y is an integer of 0 to 4; a sum of x and y is 5; each $R_4$ represents independently a hydrogen atom, an aliphatic hydrocarbon group having 1 to 5 carbon atoms or a halogen atom;

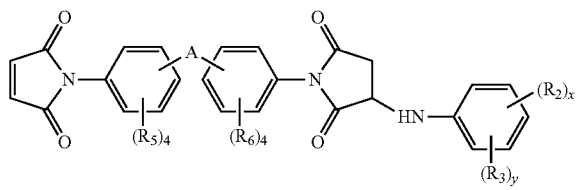

(4)

wherein $R_2$ each represents independently an acidic substituent selected from a hydroxyl group, a carboxy group and a sulfonic acid group; $R_3$ each represents independently a hydrogen atom, an aliphatic hydrocarbon group having 1 to 5 carbon atoms or a halogen atom; x is an integer of 1 to 5; y is an integer of 0 to 4; a sum of x and y is 5; $R_5$ and $R_6$ each represent independently a hydrogen atom, an aliphatic hydrocarbon group having 1 to 5 carbon atoms or a halogen atom; and A is an alkylidene group or a group represented by the following Formula (5):

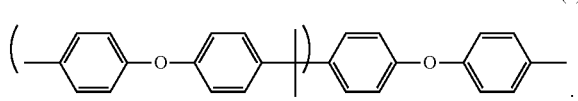

(5)

2. The thermosetting resin composition according to claim 1, further comprising (F) an inorganic filler, the inorganic filler comprising silica in an amount greater than any other inorganic filler.

3. The thermosetting resin composition according to claim 2, wherein a content of the component (C) is 0.1 to 30 parts by mass based on 100 parts by mass of a sum of the masses of the components (B) to (D) in terms of a solid matter.

4. The thermosetting resin composition according to claim 2, wherein a content of the component (C) is 0.1 to 5 parts by mass based on 90 parts by mass of a sum of the masses of the components (B) to (D) in terms of a solid matter.

5. The thermosetting resin composition according to claim 2, wherein the thermosetting resin composition further comprises a copolymer resin of a polymerizable monomer and maleic anhydride.

6. The thermosetting resin composition according to claim 5, wherein a content of the copolymer resin is 5 to 30 parts by mass based on 100 parts by mass of a sum of the masses of the components (B) to (D) in terms of a solid matter.

7. The thermosetting resin composition according to claim 2, wherein a content of the component (F) is 20 to 200 parts by mass based on 100 parts by mass of a sum of the masses of the components (B) to (D) in terms of a solid matter.

8. The thermosetting resin composition according to claim 2, wherein the inorganic filler comprises only silica.

9. The thermosetting resin composition according to claim 2, wherein the inorganic filler comprises silica and aluminum hydroxide.

10. A prepreg obtained by impregnating or coating a base material with the thermosetting resin composition according to claim 2 and then subjecting it to a B stage.

11. A laminated plate obtained by laminating and molding the prepreg according to claim 10.

12. The laminated plate according to claim 11, wherein it is a metal clad laminated plate obtained by superposing a metal foil on at least one side of the prepreg and then heating, pressing and molding it.

13. A prepreg obtained by impregnating or coating a base material with the thermosetting resin composition according to claim 1 and then subjecting it to a B stage.

14. A laminated plate obtained by laminating and molding the prepreg according to claim 13.

15. The laminated plate according to claim 14, wherein it is a metal clad laminated plate obtained by superposing a metal foil on at least one side of the prepreg and then heating, pressing and molding it.

* * * * *